United States Patent
Aigner et al.

(10) Patent No.: US 6,943,647 B2
(45) Date of Patent: Sep. 13, 2005

(54) BULK ACOUSTIC WAVE FILTER WITH A ROUGHENED SUBSTRATE BOTTOM SURFACE AND METHOD OF FABRICATING SAME

(75) Inventors: Robert Aigner, Unterhaching (DE); Pasi Tikka, Helsinki (FI); Juha Sakari Ella, Halikko (FI)

(73) Assignees: Infineon Technologies AG, Munich (DE); Nokia Corporation, Espoo (FI)

( * ) Notice: Subject to any disclaimer, the term of this patent is extended or adjusted under 35 U.S.C. 154(b) by 0 days.

(21) Appl. No.: 10/840,320

(22) Filed: May 6, 2004

(65) Prior Publication Data

US 2004/0227591 A1 Nov. 18, 2004

Related U.S. Application Data

(63) Continuation of application No. PCT/EP01/12826, filed on Nov. 6, 2001.

(51) Int. Cl.[7] .............................. H03H 9/09; H03H 9/15; H03H 9/56; H03H 3/02
(52) U.S. Cl. ....................... 333/187; 333/189; 333/191; 310/327; 29/25.35
(58) Field of Search ................................ 333/186–192; 310/326, 327, 335; 29/25.35

(56) References Cited

U.S. PATENT DOCUMENTS

| | | | | |
|---|---|---|---|---|
| 4,163,201 A | * | 7/1979 | Takahashi et al. | 333/194 |
| 5,708,402 A | * | 1/1998 | Hachisu et al. | 333/133 |
| 5,864,261 A | | 1/1999 | Weber | 333/187 |
| 5,903,087 A | * | 5/1999 | Mattson et al. | 310/365 |
| 6,150,703 A | * | 11/2000 | Cushman et al. | 257/415 |
| 6,466,105 B1 | * | 10/2002 | Lobl et al. | 333/187 |
| 6,603,241 B1 | * | 8/2003 | Barber et al. | 310/335 |
| 6,693,500 B2 | * | 2/2004 | Yang et al. | 333/189 |
| 6,720,844 B1 | * | 4/2004 | Lakin | 333/189 |

FOREIGN PATENT DOCUMENTS

| | | | | |
|---|---|---|---|---|
| FR | 2242814 | | 3/1975 | H03H/9/14 |
| FR | 2261654 | | 9/1975 | H03H/9/00 |
| FR | 2370387 | | 6/1978 | H03H/9/14 |
| WO | WO 2004/025832 | * | 3/2004 | |

OTHER PUBLICATIONS

J. Kaitila et al.; "ZnO Based Thin Film Bulk Acoustic Wave Filters for EGSM Band", 2001 IEEE Ultrasonics Symposium, vol. 1, pp. 803–806, Oct., 2001.*

Yoon Giwan et al.; "Fabrication of ZnO–based film bulk acoustic resonator devices using W/SiO2 multilayer reflector" Electronics Letters, vol. 36 No. 16.

* cited by examiner

Primary Examiner—Barbara Summons
(74) Attorney, Agent, or Firm—Baker Botts L.L.P.

(57) ABSTRACT

A filter device comprises a substrate having a top surface and a bottom surface, and at least one acoustic wave situated on the top surface of the substrate, wherein the bottom surface of the substrate is roughened to reduce the reflection of an acoustic wave back to the acoustic wave filter. The effect achieved by the roughening of the bottom surface of the substrate that an acoustic wave which is generated by the acoustic wave filter and reaches the bottom surface of the substrate, is basically scattered so the acoustic wave that is actually reflected back to the acoustic wave device is reduced which, in turn, improves the performance characteristics of the acoustic wave filter.

20 Claims, 5 Drawing Sheets

BULK ACOUSTIC WAVE FILTER WITH A ROUGHENED SUBSTRATE BOTTOM SURFACE AND METHOD OF FABRICATING SAME

CROSS REFERENCE TO RELATED APPLICATION

This application is a continuation of copending International Application No. PCT/EP01/12826 filed Nov. 6, 2001 which designates the United States.

TECHNICAL FIELD OF THE INVENTION

The present invention generally relates to filter devices. The present invention especially relates to acoustic wave filter devices, e. g. Surface Acoustic Wave (SAW) filter devices, and/or Bulk Acoustic Wave (BAW) filter devices.

DESCRIPTION OF RELATED ART AND BACKGROUND OF THE INVENTION

The need for using miniature and high performance filters in wireless communication devices has led to the widespread usage of Surface Acoustic Wave (SAW) filters. In addition to Surface Acoustic Wave (SAW) filters Bulk Acoustic Wave (BAW) filters can also be used. Bulk Acoustic Wave (BAW) filters typically include several Bulk Acoustic Wave(BAW) resonators. In a Bulk Acoustic Wave (BAW) filter, acoustic waves propagate in a direction that is perpendicular to the filter's layer surfaces. In contrast, acoustic waves which propagate within a Surface Acoustic Wave (SAW) filter do so in a direction that is parallel to the layer surfaces of the filter.

It is known to fabricate monolithic filters that include at least a Bulk Acoustic Wave (BAW) resonator device (also known in the art as "Thin Film Bulk Acoustic Wave Resonators (FBARs)"). By example, Bulk Acoustic Wave (BAW) resonators typically include two electrodes and a single piezoelectric layer that is deposited between the two electrodes. One or more acoustic isolation layers may also be employed between the piezoelectric layer and a substrate of the respective devices.

Bulk Acoustic Wave (BAW) filters can be fabricated to include various known types of Bulk Acoustic Wave (BAW) resonators. These known types of Bulk Acoustic Wave (BAW) resonators comprise three basic portions. A first one of the portions, which is used to generate acoustic waves, includes an acoustically-active piezoelectric layer. This layer may comprise, by example, zinc-oxide(ZnO), aluminum nitride(AlN), zinc-sulfur (ZnS), or any other suitable piezoelectric material that can be fabricated as a thin film. A second one of the portions includes electrodes that are formed on opposite sides of the piezoelectric layer. A third portion of the Bulk Acoustic Wave (BAW) resonator includes a mechanism for acoustically isolating the substrate from vibrations produced by the piezoelectric layer. Bulk Acoustic Wave (BAW) resonators are typically fabricated on silicon, gallium arsenide, or glass substrates using thin film technology (e.g., sputtering, chemical vapor deposition, etc.). Bulk Acoustic Wave (BAW) resonators exhibit series and parallel resonances that are similar to those of, by example, crystal resonators. Resonant frequencies of Bulk Acoustic Wave (BAW) resonators can typically range from about 0.5 GH to 5 GHz, depending on the layer thicknesses of the devices.

FIG. 1 shows an example of a Bulk-Acoustic-Wave (BAW) resonator using an acoustic mirror to acoustically isolate the resonator from the substrate. The Bulk Acoustic Wave (BAW) resonator 20 comprises a substrate 10 having a top surface 12 and a bottom surface 14. Acoustic mirror 31 overlies the top surface 12 of the substrate. The resonator further comprises a piezoelectric layer 22 interposed between a first electrode 21 and a second electrode 23, and a protective layer 16. The piezoelectric layer 22 comprises, by example, a piezoelectric material that can be fabricated as a thin film such as, by example, zinc-oxide (ZnO), or aluminum nitride (AlN).

In the example shown in FIG. 1 the acoustic mirror 31 comprises three layers, namely a top layer 31 a, a middle layer 31b, and a bottom layer 31c. Each layer 31a, 31b and 31c has a thickness that is, by example, approximately equal to one quarter wavelength of the resonance frequency of the resonator. The top layer 31a and bottom layer 31c are made of materials having low acoustic impedances such as, by example, silicon oxide($SiO_2$), poly-silicon, aluminum(Al), or a polymer. Also, the middle layer 31b is made of a material having a high acoustic impedance such as, by example, gold (Au), molybdenum (Mo), or tungsten (W). The ratio of the acoustic impedances of consecutive layers is large enough to permit the impedance of the substrate to be transformed to a lower value. As a result, the substrate 10 may be comprised of various high acoustic impedance materials or low acoustic impedance materials (e.g., Si, $SiO_2$, GaAs, glass, or a ceramic material). The number of layers in an acoustic mirror can vary broadly depending on the degree of acoustic isolation required for the respective filter device. Usually three to up to nine layers are used, wherein uneven and even numbers of layers are possible.

In FIG. 2 an example of a BAW device is shown which comprises a Stacked-Crystal-Filter (SCF) on a substrate 10.

The Stacked Crystal Filter (SCF) 50 comprises a lower electrode 21, a middle electrode 23, and a top electrode 25.

Interposed between the lower and the middle electrode is a first piezoelectric layer 22. Interposed between the middle and the upper electrode is a second piezoelectric layer 24.

The piezoelectric layer 22 comprises, by example, a piezoelectric material that can be fabricated as a thin film such as, by example, zinc-oxide(ZnO), or aluminum-nitride (AlN). The second piezoelectric layer 24 may comprise similar materials as the first piezoelectric layer 22. The middle electrode 23 is usually employed as a ground electrode. The top electrode 25 may comprise similar materials as the bottom and middle electrodes 21 and 23, for example Al.

The solidly-mounted Stacked Crystal Filter 50 shown in FIG. 2 comprises an acoustic mirror 31 which acoustically isolates vibrations produced by the piezoelectric layers 22 and 24 from the substrate 10. The acoustic mirror 31 shown in FIG. 2 also comprises three layers, namely a top layer 31a, a middle layer 31b, and a bottom layer 31c. Each layer 31a, 31b and 31c has a thickness that is, by example, approximately equal to one quarter wavelength of the resonance frequency of the resonator. The top layer 31a and bottom layer 31c are made of materials having low acoustic impedances such as, by example, silicon oxide($SiO_2$), poly-silicon, aluminum (Al), or a polymer. Also, the middle layer 31b is made of a material having a high acoustic impedance such as, by example, gold (Au), molybdenum (Mo), or tungsten (W). It should be noted that a membrane or tuning layer (not shown) may also be provided between the acoustic mirror 31 and the electrode 21 of the device 50, if needed for tuning the device 50 to enable it to provide desired frequency response characteristics.

A problem encountered with solidly mounted Bulk-Acoustic-Devices is that the acoustic isolation of the resonator by the acoustic mirror is not complete and that therefore a part of the acoustic energy leaks into the substrate and is reflected from the bottom surface of the substrate back up to the resonator. This phenomena causes ripples in the filter's passband, deteriorating it's performance. For some frequencies, depending on the thickness of the substrate, the substrate may even form an acoustic cavity, which increases the negative effects on the resonators.

In order to lessen these deteriorating effects, it has been proposed to use substrate materials which have a high absorbency for the acoustic waves in question. Therefore, most of the energy of the acoustic wave which leaked into the substrate is absorbed before the wave reaches the bottom surface of the substrate. A suitable material is for instance glass. The problem with this solution is that glass substrates are not compatible with standard CMOS production processes.

Alternatively it has been suggested to increase the number of mirror layers or to use a very thick acoustic mirror made of tungsten to decrease the leakage of acoustic energy into the substrate. Unfortunately, both these solutions cause considerable additional costs in the production of such devices.

Another approach to avoid this problem is to use bridge type BAW-resonators in the filter devices. Such resonators use an air gap underneath the resonator to acoustically isolate it. However, the costs for fabricating such bridge-type BAW resonators is much higher than for those using acoustic mirrors. Furthermore, the use of bridge-type resonators puts further constraints regarding suitable packaging of such filter devices.

SUMMARY OF THE INVENTION

Accordingly, there is a demand for acoustic filter devices in which the deteriorating effects caused by reflection of acoustic energy in the substrate is reduced.

Especially, there is a demand for a cost-effective solution which can be easily integrated into standard CMOS production processes.

The foregoing and other problems can be overcome by a filter device, the filter device comprising a substrate having a top surface and a bottom surface; and at least one Bulk Acoustic Wave filter comprising at least one Bulk Acoustic Wave resonator, having a resonance frequency of from 0.5 to 5 GHz, the Bulk Acoustic Wave filter being in contact with the top surface of the substrate, wherein the bottom surface of the substrate is roughened to reduce the reflection of an acoustic wave back to the Bulk Acoustic Wave filter.

The average height difference between the peaks and the valleys on the roughened bottom surface of the substrate can be larger than $0.2\lambda$, preferably larger than $0.5\lambda$. The average lateral distance between the peaks and the valleys on the roughened bottom surface of the substrate can be smaller than $3\lambda$, preferably smaller than $2\lambda$. The acoustic wave filter can be a Bulk Acoustic Wave filter comprising at least one Stacked-Crystal-Filter. The Bulk Acoustic Wave filter can further comprise at least one acoustic mirror. The acoustic mirror can be arranged between the Bulk Acoustic Wave resonator or the Stacked-Crystal-Filter and the top surface of the substrate. The acoustic mirror may comprise only two pairs of mirror-layers and each pair of the mirror-layers may comprise a layer of a material having a high acoustic impedance and a layer of a material having a low acoustic impedance and both pairs of mirror-layers may be arranged in respect to each other such that the two layers of material having a high acoustic impedance are separated by one layer of material having a low acoustic impedance. The substrate can be a silicon substrate.

The object can also be achieved by a method of fabricating a filter device, comprising the steps of a) providing a substrate having a top surface and a bottom surface;

b) forming at least one Bulk Acoustic Wave filter on the top surface of the substrate, the Bulk Acoustic Wave filter comprising at least one Bulk Acoustic Wave resonator having a resonance frequency of from 0.5 to 5 GHz,; and c) roughening the bottom surface of the substrate such that the reflection of an acoustic wave back to the Bulk Acoustic Wave filter is reduced.

The roughening step c) can be carried out simultaneously with the thinning of the substrate. The roughening of the bottom surface can be achieved by mechanical roughening. The roughening of the bottom surface can be achieved by sanding. The roughening of the bottom surface can also be achieved by etching, preferably wet etching. The acoustic wave filter can be a Bulk Acoustic Wave filter comprising at least one Staked-Crystal-Filter. The step b) may further comprise the step of forming an acoustic mirror to be situated between the top surface of the substrate and the Bulk Acoustic Wave resonator or Stacked-Crystal-Filter of the acoustic wave filter. The substrate can be a silicon substrate.

The various embodiments are intended to be understood as a first non-limiting approach of defining the invention in general terms.

The present invention provides a filter device comprising: a) a substrate having a top surface and a bottom surface; b) at least one acoustic wave filter in contact with the top surface of the substrate, wherein the bottom surface of the substrate is roughened to reduce the reflection of an acoustic wave back to the acoustic wave filter.

The effect achieved by the roughening of the bottom surface of the substrate is that an acoustic wave which is generated by the acoustic wave filter and reaches the bottom surface of the substrate, is basically scattered at the roughened bottom surface. Accordingly the portion of the acoustic wave that is actually reflected back to the acoustic wave device is reduced which, in turn, improves the performance characteristics of the acoustic wave filter. In that manner, the acoustic wave filter may reach performance levels similar to those of a bridge-type filter but avoids the disadvantages of bridge-type filters with regard to the production complexity.

The substrate can be made of any material usually used as substrates in micro-chip technology, especially CMOS-technology. In a preferred embodiment of the present invention the substrate is a silicon substrate. This has the advantage that silicon substrates are fully compatible with standard CMOS-technology. As used in the present context, the top surface of the substrate is that surface of the substrate on which the acoustic wave filter is formed. The acoustic wave device can either be directly formed on the top surface of the substrate or additional layers, such as, for instance, tuning layers can be interposed between the acoustic wave device and the substrate. In both alternatives the acoustic wave device is in the context of the present invention considered to be "in contact" with the top surface of the substrate.

In a preferred embodiment of the present invention the average height difference between the peaks and the valleys on the roughened bottom surface of the substrate is larger than 0.2λ, preferably larger than 0.5λ. Thereby λ is the wavelength of the acoustic wave that is generated by the acoustic wave filter. Furthermore, it is preferred that the average lateral distance between the peaks and the valleys on the roughened bottom surface of the substrate is smaller than 3λ, preferably smaller than 2λ.

In another preferred embodiment of the present invention the acoustic wave filter is a Bulk Acoustic Wave (BAW) filter comprising at least one Bulk Acoustic Wave resonator. In yet another preferred embodiment of the present invention the acoustic wave filter is a Bulk Acoustic Wave (BAW) filter comprising at least one Stacked-Crystal-Filter (SCF). These types of acoustic wave filters are well known in art as well as the process for forming them on substrates as already discussed in connection with FIG. 1 and FIG. 2 of this application.

In a further preferred embodiment of the present invention the acoustic filter device further comprises at least one acoustic mirror which is preferably arranged between the acoustic wave filter and the top surface of the substrate. In an especially preferred embodiment of the invention the acoustic mirror comprises only two pairs of mirror-layers and each pair of the mirror-layers comprises a layer of a material having a high acoustic impedance and a layer of a material having a low acoustic impedance and both pairs of mirror-layers are arranged in respect to each other such that the two layers of material having a high acoustic impedance are separated by one layer of material having a low acoustic impedance.

The filter devices according to the present invention allow a significant reduction of the number of mirror layers necessary to acoustically isolate the substrate from the acoustic wave filter. It may even be possible to omit the acoustic mirror completely. The reduction of the number of mirror layers used reduces the cost of the filter device and furthermore makes it possible that the acoustic mirror is optimized regarding other parameters than reduction of reflection within the substrate, such as, for instance, temperature behavior.

In a further aspect of the present invention a method for fabricating a filter device is provided, comprising the steps of a) providing a substrate having a top surface and a bottom surface, b) forming at least one acoustic wave filter device on the top surface of the substrate, and c) roughening the bottom surface of the substrate such that the reflection of an acoustic wave back to the acoustic wave filter is reduced.

Although it is preferred that steps a), b) and c) are performed in this sequence, it also possible that the roughening step c) is carried out before forming step b).

Furthermore, it is preferred that the roughening step c) is carried out simultaneously with the thinning of the substrate. In this case no additional process step and especially no additional etching step is necessary. This again is very cost-effective.

In a further preferred embodiment of the method of the present invention the roughening is achieved by mechanical roughening, most preferably by sanding. The roughening can be achieved by using conventional sanding equipment such as a plate sander. Additionally, especially adapted chemical-mechanical-polishing processes can be used. The degree of roughness can be controlled by the use of corresponding abrasive grains during the roughening step.

In a further preferred embodiment of the method of the present invention the roughening is achieved by etching, preferably wet etching (e. g. $HNO_3$ or HF). But any other method by which the bottom surface of the substrate can be roughened to the required surface roughness is also suitable.

In another preferred embodiment of the method of the present invention the acoustic wave filter is a Bulk Acoustic Wave (BAW) filter comprising at least one Bulk Acoustic Wave resonator. In yet another preferred embodiment of the method of the present invention the acoustic wave filter is a Bulk Acoustic Wave (BAW) filter comprising at least one Stacked-Crystal-Filter (SCF). These types of acoustic wave filters are well known in the art as well as the processes for forming them on substrates as has already been discussed above.

In yet another preferred embodiment of the method of the present invention step b) comprises forming an acoustic mirror to be situated between the top surface of the substrate and the resonator or Stacked-Crystal-Filter (SCF) of the acoustic wave filter. The acoustic mirror is preferably made of mirror-layers as already described above in connection with the filter devices according to the present invention.

In a further embodiment of the method of the present invention the substrate is a silicon substrate such as a silicon wafer.

BRIEF DESCRIPTION OF THE DRAWINGS

Some of the above indicated and other more detailed aspects of the invention will be described in the following description and partially illustrated with reference to the figures. Therein.

DETAILED DESCRIPTION OF EMBODIMENTS

Figure 3:
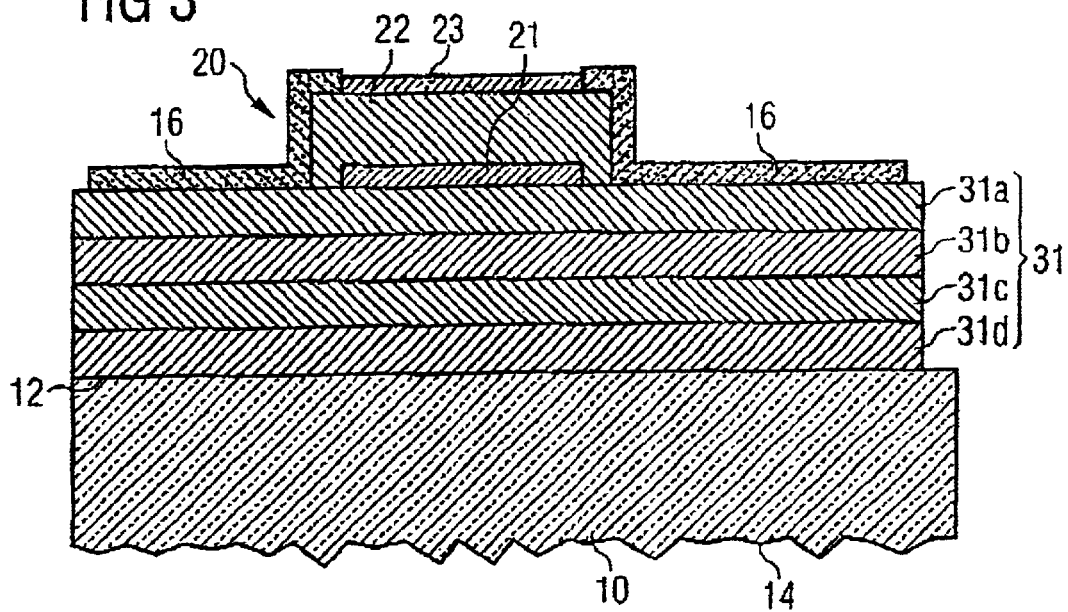
FIG. 3 shows a filter device according to a first embodiment of the present invention.

FIG. 3 shows a resonator comprised in an acoustic wave filter used in a filter device according to a first embodiment of the present invention.

Figure 1:
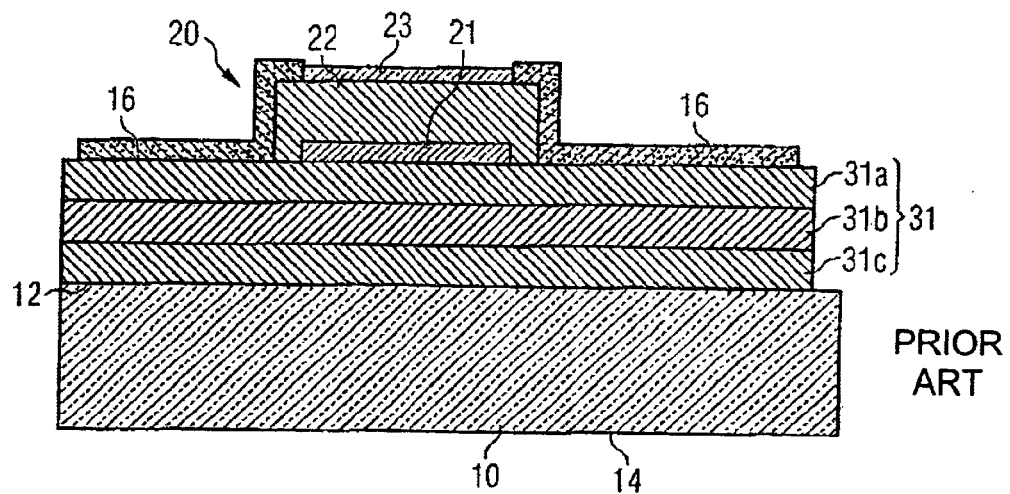
FIG. 1 shows schematically a cross-section of an exemplary Bulk Acoustic Wave (BAW) resonator that includes an acoustic mirror.
Figure 2:
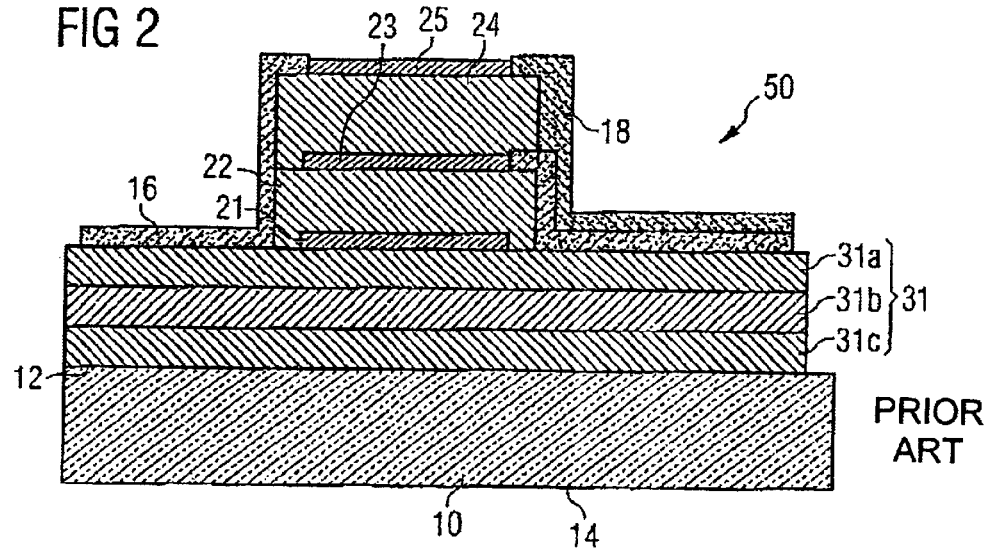
FIG. 2 shows schematically a cross-section of an exemplary solidly-mounted Stacked Crystal Filter (SCF) that includes an acoustic mirror.

The resonator shown in FIG. 3 is a bulk acoustic wave resonator and essentially corresponds to the one described with respect to FIG. 1 of this application. Corresponding reference numerals in FIG. 3 denote parts corresponding to those of FIG. 1.

Contrary to the bulk acoustic resonator disclosed in FIG. 1 the resonator according to FIG. 3 comprises a substrate (10) in which the bottom surface of the substrate (14) has been roughened such that the reflection of an acoustic wave back to the acoustic wave filter is reduced. Thereby, the average height difference between the peaks and the valleys on the roughened bottom surface of the substrate is larger than 0.2λ, preferably larger than 0.5λ. In typical applications the average height difference between the peaks and the valleys is larger than 2 µm, preferably larger than 3 µm and most preferred larger than 5 µm.

Furthermore, the average lateral distance between the peaks and the valleys on the roughened bottom surface of the substrate is smaller than 3λ, preferably smaller than 2λ.

Furthermore, in the preferred embodiment according to FIG. 3 the acoustic mirror two pairs of mirror layers, each pair comprising a layer of a material having a low acoustic impedance (31a, 31c) and a layer of a material having a high acoustic impedance (31b, 31d). The number of layers in the acoustic mirror in the filter devices according to the present invention can be varied in order to optimize the mirror stack regarding properties other than the minimization of the reflection of acoustic waves in the substrate. Such a property can be temperature behavior, for instance.

Principally, an acoustic wave filter according to present invention which corresponds to a prior art acoustic wave filter and comprising an identical acoustic mirror but which differs in the feature that the bottom surface of the substrate has been roughened will exhibit less acoustic wave reflection in the substrate than the prior art acoustic wave filter.

Figure 4A:
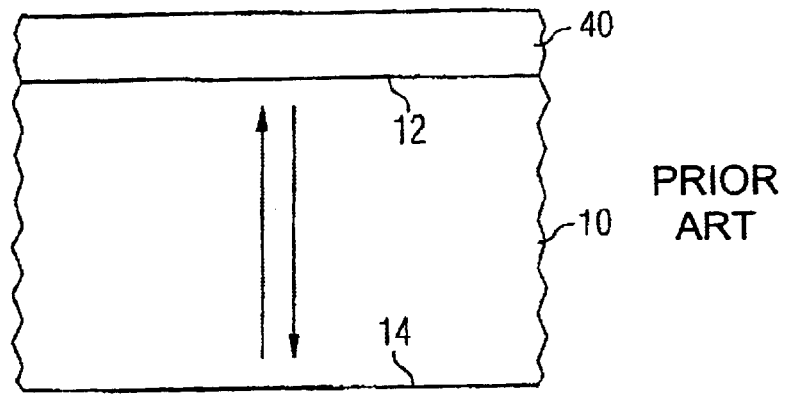
FIGS. 4a and b show a schematic comparison of acoustic wave reflection at the bottom surface of a substrate in a) a prior art filter device and b) in a filter device according to the present invention.

This effect is further explained with reference to FIGS. 4a and b. FIGS. 4a and b show a schematic comparison of acoustic wave reflection at the bottom surface (14) of a substrate (10) in a prior art filter device (FIG. a) and in a filter device according to the present invention (FIG. b). In FIG. 4a, the substrate (10) has a top surface (12) and a bottom surface (14) which has not been roughened. The acoustic waves leaking from the acoustic wave filter (40) into the substrate (10) propagate to the bottom surface (14) and are coherently reflected at the smooth bottom surface (14) back up towards the acoustic wave filter (40). This is indicated by the two arrows in FIG. 4a. The acoustic waves reflected back towards the acoustic wave filter (40) and cause ripples in the passband of the resonator and consequently in the passband of the filter, which deteriorates it's performance.

Figure 4B:
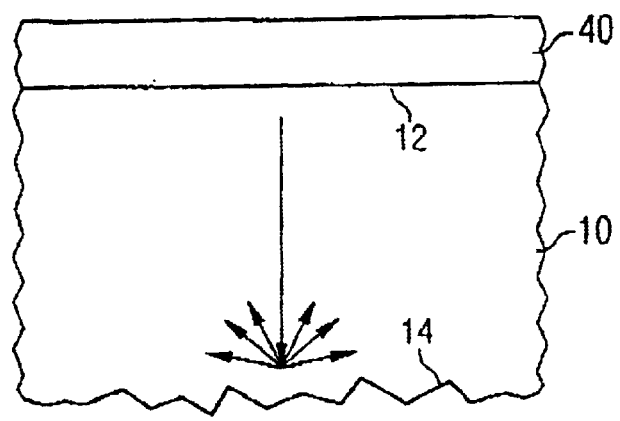

Due to the coherence of the reflected waves in respect to the incoming waves the substrate at certain wavelengths forms an acoustic cavity which further amplifies the deteriorating effects due to the coupling of the reflected waves into the resonator. Contrary to this, in the filter device according to the present invention shown in FIG. 4b the bottom surface (14) of the substrate (10) has been roughened. Acoustic waves leaking from the acoustic wave filter (40) and reaching the bottom surface (14) are scattered in all directions at the roughened surface.

Accordingly, the portion of the acoustic wave that is actually reflected back to the acoustic wave device is reduced. Therefore, the negative effects caused by the reflection of acoustic waves back to the acoustic wave filter are avoided in the filter devices according to the present invention.

FIGS. 5 to 9 show a comparison of the results of different measurements on filter devices in which the substrate of the filter device has been roughened in accordance with the present invention and the same filter devices without the roughening of the bottom surface of the substrate of the filter device. The measurements were carried out on 900 MHz resonators. In the filter devices according to the present invention the bottom surface of the substrate was roughened using a conventional plate sander which is normally used in woodwork.

Figure 5:
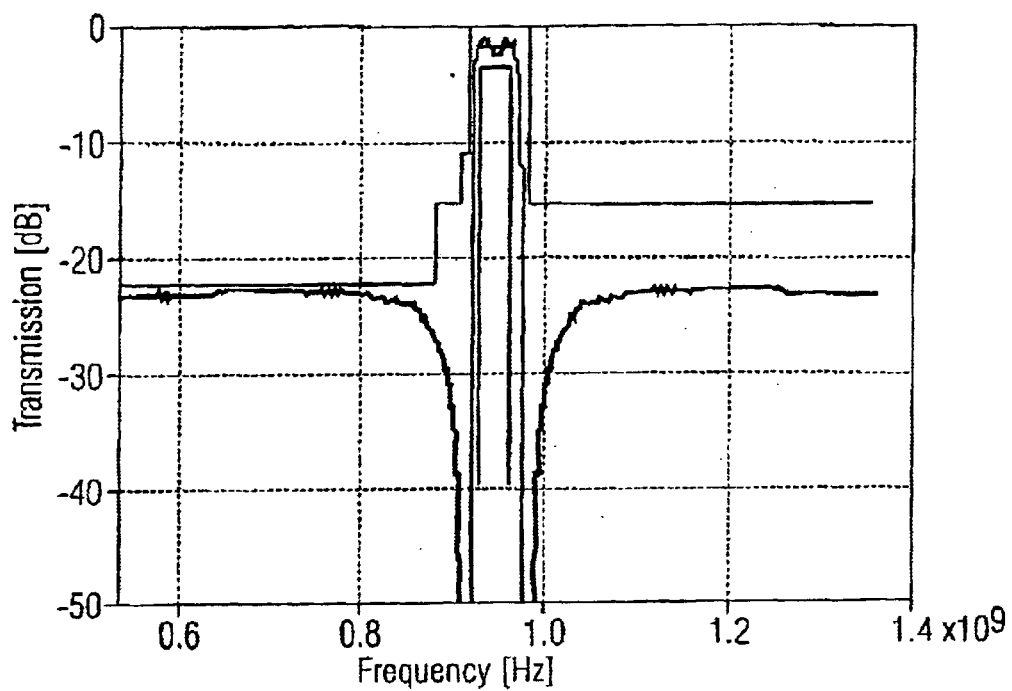
FIG. 5 shows a graph of the transmission of a 3.5-step ladder-type filter device in which the bottom surface of the substrate has not been roughened.
Figure 6:
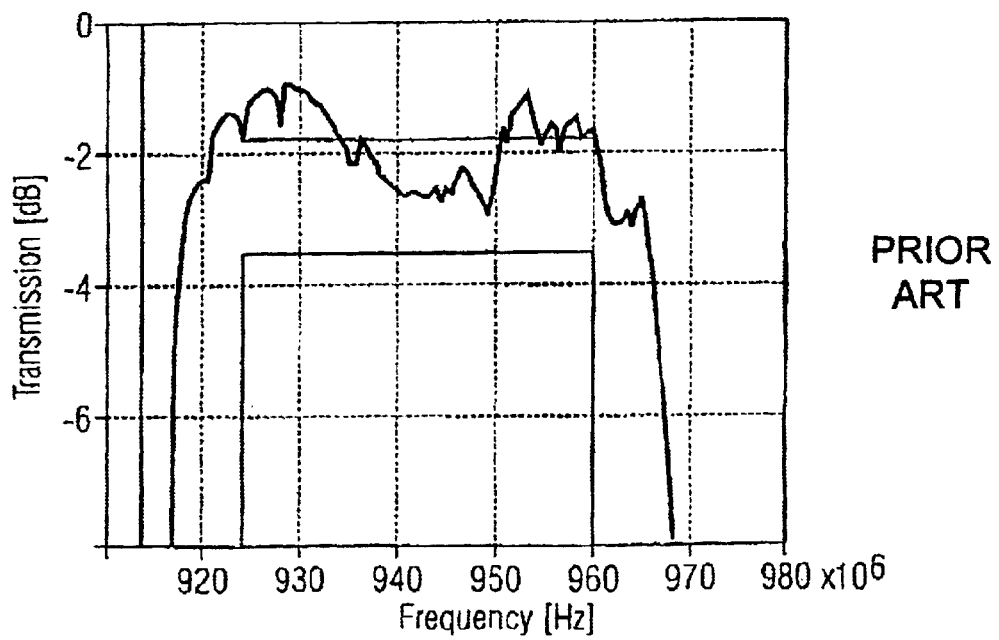
FIG. 6 shows a zoomed view of the passband section of the graph according to FIG. 5.

FIG. 5 shows the transmission of a 3.5 step ladder type filter device as a function of the frequency. The measurement was carried out using a suitable method to measure the $S_{21}$-component of the scattering matrix of the filter device. The definition of the scattering matrix of a filter device is known to the person skilled in the art and can for instance be found in "*Zinke, Brunswig; Hochfrequenztechnik* 1, 6th edition, Springer Verlag, pages 182 to 185" the disclosure of which is herewith incorporated by reference.

In the filter device according to FIG. 5, the bottom surface of the substrate of the filter device was not roughened prior to the measurement of the transmission. In the zoomed view of the passband-section of the transmission measurement of FIG. 5 shown in FIG. 6 the transmission shows numerous ripples in the frequency range from about 920 to 965 MHz. These ripples deteriorate the performance of the filter.

Figure 7:
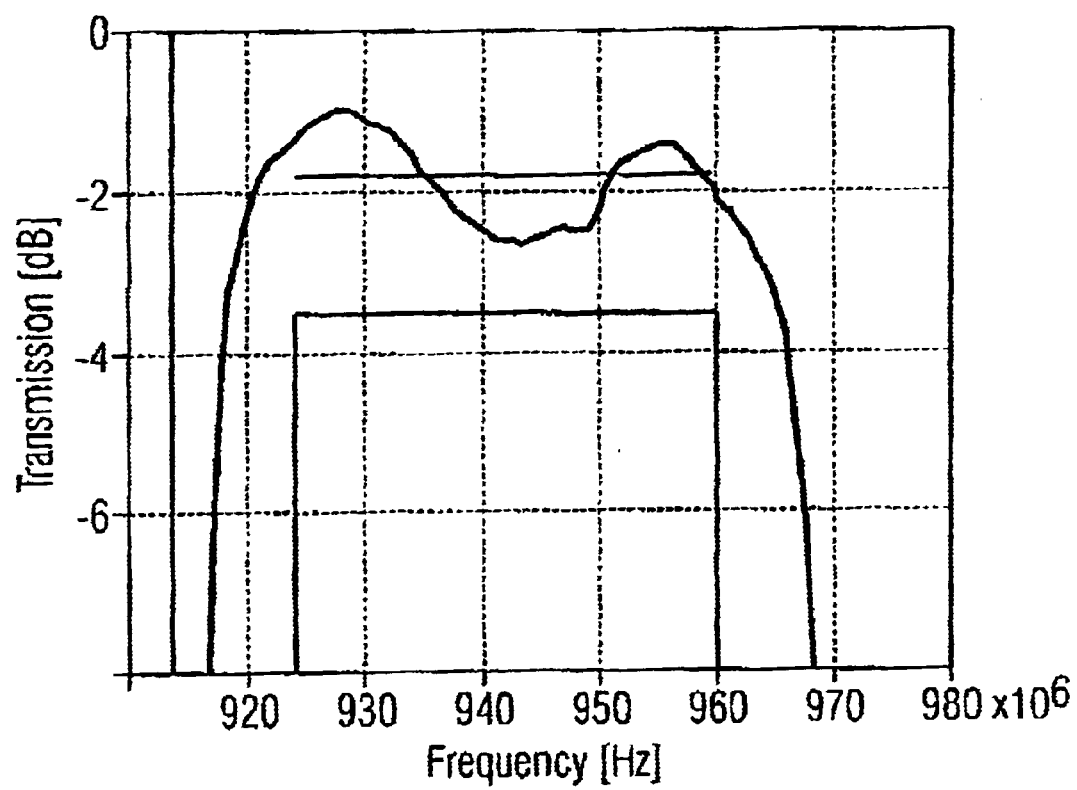
FIG. 7 shows a zoomed view of the passband section of a graph of the transmission of a filter device corresponding to that of FIG. 5, but in which in accordance with the present invention the bottom surface of the substrate of the filter device is roughened.

Contrary to this, as shown in FIG. 7, the corresponding filter device in which the bottom surface of the substrate of the filter device is roughened in accordance with the present invention, the transmission shows no such ripples in the passband-section and therefore shows an improved performance as compared to the filter devices in which the bottom surface of the substrate of the filter device is not roughened.

Figure 8:
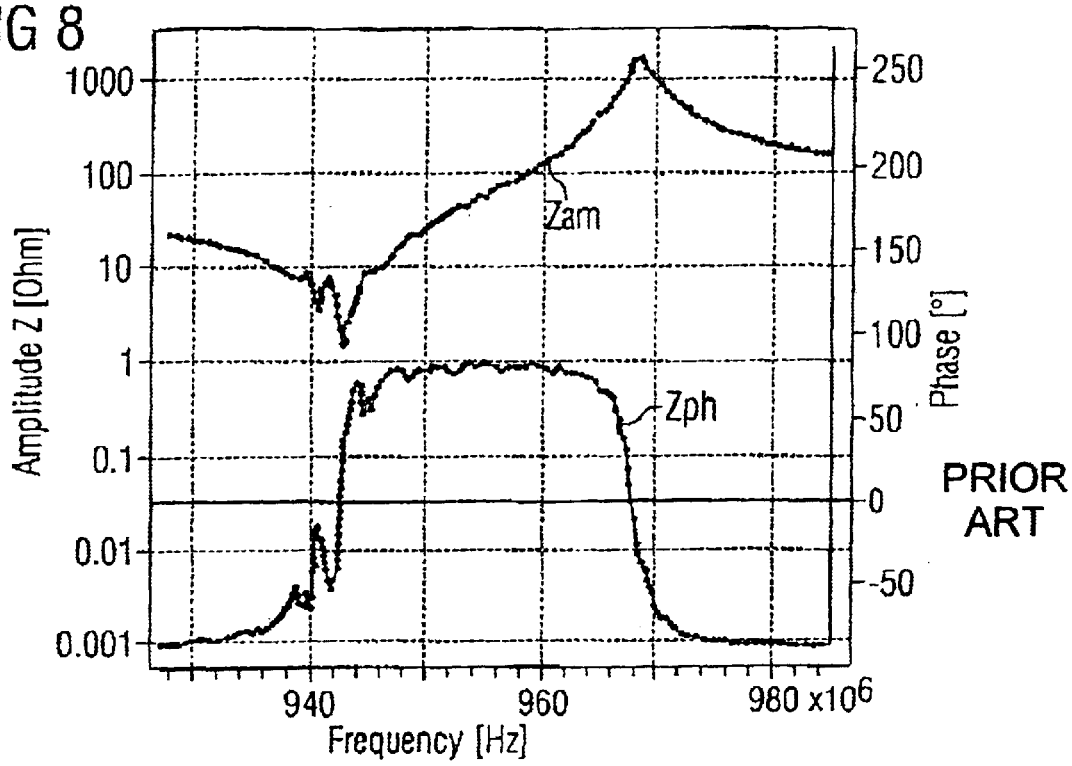
FIG. 8 shows a graph in which the amplitude ($Z_{am}$) and phase($Z_{ph}$) of the impedance of a prior art filter device as a function of the frequency.
Figure 9:
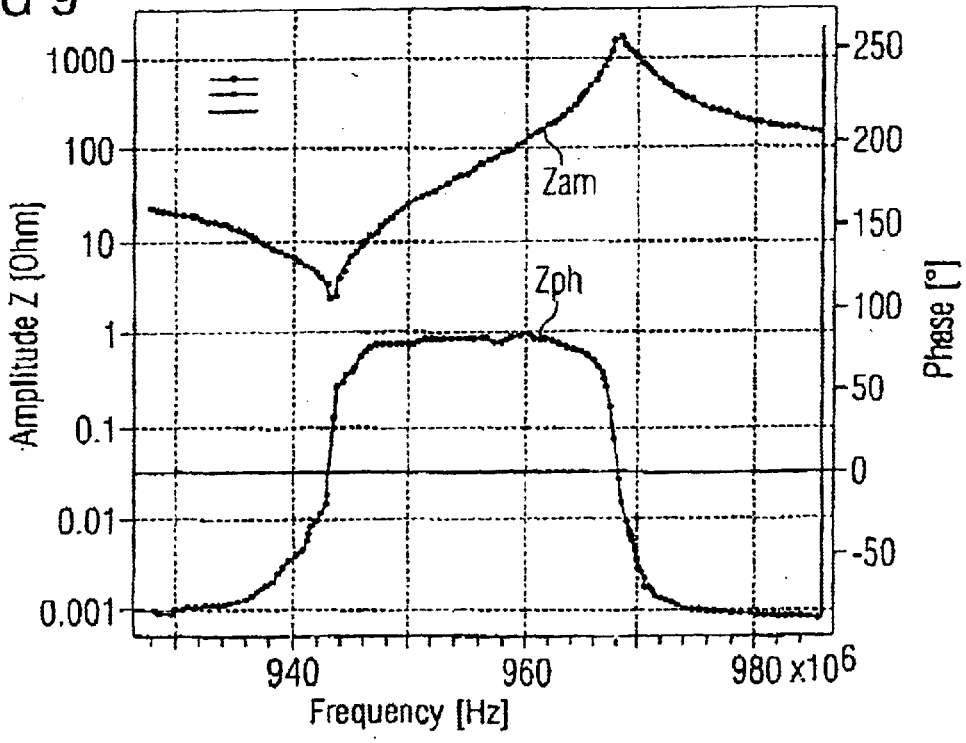
FIG. 9 shows a graph in which the amplitude($Z_{am}$) and phase($Z_{ph}$) of the impedance of a filter device corresponding to that of FIG. 8 is shown, but in which the bottom surface of the substrate of the filter device is roughened in accordance with the present invention.

The positive effect achieved by the filter devices according to the present invention becomes also apparent from FIGS. 8 and 9. In FIGS. 8 and 9 the amplitude and the phase of the $S_{11}$-component of the scattering matrix are measured as a function of the frequency. The measurement was carried out using a suitable method of measurement of the $S_{11}$-component of the scattering matrix of the filter devices.

FIG. 8 relates to a filter device without a roughened bottom surface of the substrate of the filter device, whereas FIG. 9 relates to the corresponding filter device in which the bottom surface of the substrate of the filter device is roughened according to the present invention.

As can be seen by the comparison of both the amplitude ($Z_{am}$) and the phase ($Z_{ph}$) of the impedance of the filter device in which the bottom surface of the substrate of the filter device has not been roughened (FIG. 8) and the filter device according to present invention (FIG. 9), the $S_{11}$-component of the filter device according to the present invention does not exhibit any substantial ripples in both amplitude ($Z_{am}$) and phase ($Z_{ph}$), whereas the performance of the filter device which has not been roughened shows is deteriorated by the ripples in both amplitude ($Z_{am}$) and phase ($Z_{ph}$) of the $S_{11}$-component, especially in the range between about 935 MHz to 950 MHz.

We claim:

1. A filter device, said filter device comprising:
    a) a substrate having a top surface and a bottom surface; and
    b) at least one Bulk Acoustic Wave filter comprising at least one Bulk Acoustic Wave resonator, having a resonance frequency of from 0.5 to 5 GHz, said Bulk Acoustic Wave filter being in contact with the top surface of the substrate,
    wherein the bottom surface of the substrate is roughened to reduce the reflection of an acoustic wave back to the Bulk Acoustic Wave filter.

2. The filter device as set forth in claim 1, wherein the average height difference between the peaks and the valleys on the roughened bottom surface of the substrate is larger than 0.2λ, preferably larger than 0.5λ.

3. The filter device as set forth in claim 2, wherein the average lateral distance between the peaks and the valleys on the roughened bottom surface of the substrate is smaller than 3λ, preferably smaller than 2λ.

4. The filter device as set forth in claim 1, wherein the average lateral distance between the peaks and the valleys on the roughened bottom surface of the substrate is smaller than 3λ, preferably smaller than 2λ.

5. The filter device as set forth in claim 1, wherein said acoustic wave filter is a Bulk Acoustic Wave filter comprising at least one Stacked-Crystal-Filter.

6. The filter device as set forth in claim 1, wherein the Bulk Acoustic Wave filter further comprises at least one acoustic mirror.

7. The filter device as set forth in claim 6, wherein the acoustic mirror is arranged between the Bulk Acoustic Wave resonator or a Stacked-Crystal-Filter and the top surface of the substrate.

8. The filter device as set forth in claim 7, wherein the acoustic mirror comprises only two pairs of mirror-layers and each pair of said mirror-layers comprises a layer of a material having a high acoustic impedance and a layer of a material having a low acoustic impedance and both pairs of mirror-layers are arranged in respect to each other such that the two layers of material having a high acoustic impedance are separated by one layer of material having a low acoustic impedance.

9. The filter device as set forth in claim 6, wherein the acoustic mirror comprises only two pairs of mirror-layers and each pair of said mirror-layers comprises a layer of a material having a high acoustic impedance and a layer of a material having a low acoustic impedance and both pairs of mirror-layers are arranged in respect to each other such that the two layers of material having a high acoustic impedance are separated by one layer of material having a low acoustic impedance.

10. The filter device as set forth in claim 1, wherein the substrate is a silicon substrate.

11. A method of fabricating a filter device, comprising the steps of
   a) providing a substrate having a top surface and a bottom surface;
   b) forming at least one Bulk Acoustic Wave filter on the top surface of the substrate, said Bulk Acoustic Wave filter comprising at least one Bulk Acoustic Wave resonator having a resonance frequency of from 0.5 to 5 GHz; and
   c) roughening the bottom surface of the substrate such that the reflection of an acoustic wave back to the Bulk Acoustic Wave filter is reduced.

12. The method as set forth in claim 11, wherein the roughening step c) is carried out simultaneously with a thinning of the substrate.

13. The method as set forth in claim 12, wherein the roughening of the bottom surface is achieved by etching, preferably wet etching.

14. The method as set forth in claim 12, wherein the roughening of the bottom surface is achieved by mechanical roughening.

15. The method as set forth in claim 11, wherein the roughening of the bottom surface is achieved by sanding.

16. The method as set forth in claim 11, wherein the roughening of the bottom surface is achieved by etching, preferably wet etching.

17. The method as set forth in claim 11, wherein the roughening of the bottom surface is achieved by mechanical roughening.

18. The method as set forth in claim 11, wherein said acoustic wave filter is a Bulk Acoustic Wave filter comprising at least one Stacked-Crystal-Filter.

19. The method as set forth in claim 11, wherein said step b) comprises forming an acoustic mirror to be situated between the top surface of the substrate and the Bulk Acoustic Wave resonator or a Stacked-Crystal-Filter of the acoustic wave filter.

20. The method as set forth in claim 11, wherein said substrate is a silicon substrate.

* * * * *